United States Patent [19]
Van Dalfsen

[11] Patent Number: 4,990,834
[45] Date of Patent: Feb. 5, 1991

[54] LINE DEFLECTION CIRCUIT ARRANGEMENT FOR A PICTURE DISPLAY DEVICE

[75] Inventor: Age J. Van Dalfsen, Eindhoven, Netherlands

[73] Assignee: U.S. Philips Corporation, New York, N.Y.

[21] Appl. No.: 446,498

[22] Filed: Dec. 4, 1989

[30] Foreign Application Priority Data

Dec. 23, 1988 [NL] Netherlands .......................... 8803154

[51] Int. Cl.$^5$ .......................... H01J 29/70; G09G 1/04
[52] U.S. Cl. .................................... 315/411; 315/387; 315/408
[58] Field of Search ...................... 315/408, 411, 387; 358/190

[56] References Cited

U.S. PATENT DOCUMENTS 3,809,947  5/1974  Ambrico et al. ..................... 315/403
4,547,711  10/1985  Gehrmann ........................... 315/408

Primary Examiner—Gregory C. Issing
Attorney, Agent, or Firm—Michael E. Marion

[57] ABSTRACT

A circuit arrangement for a picture display device for generating an essentially sawtooth-shaped line deflection current with a trace and a retrace through a deflection coil, which circuit arrangement comprises a series circuit of a trace capacitor, the line deflection coil and a bidirectionally conducting, line frequency-controlled switch which is conducting during the trace time and is not conducting during the retrace time, in which retrace time the deflection coil and a retrace capacitor are part of a resonant network. The series circuit also comprises a voltage source, while the losses in the series circuit are so low that the sum of the DC components of the voltage of the source and of the voltage across the trace capacitor is many times higher, at least 5 times, than the amplitude of the AC component of the source. The deflection current is given a desired variation by means of three controls.

18 Claims, 1 Drawing Sheet

LINE DEFLECTION CIRCUIT ARRANGEMENT FOR A PICTURE DISPLAY DEVICE

BACKGROUND OF THE INVENTION

The invention relates to a circuit arrangement for a picture display device for generating an essentially sawtooth-shaped line deflection current with a trace and a retrace through a deflection coil, which circuit arrangement comprises a series circuit of a trace capacitor, the line deflection coil and a bidirectionally conducting, line frequency-controlled switch which is conducting during the trace time and is not conducting during the retrace time, in which retrace time the deflection coil and a retrace capacitor are part of a resonant network.

Such a circuit arrangement for a picture display device is generally known. During the trace time the retrace capacitor is short-circuited by the switch, while the deflection coil is connected to the voltage of the trace capacitor, the trace voltage. The line deflection current initially having a linear variation as a function of time flows through the coil. During the retrace time, the retrace capacitor and the coil form part of a resonant network, in which time the current goes from the maximum value in one direction to the same value in the other direction. The periodical opening and closing of the switch at the line frequency thus results in a sawtooth-shaped current through the deflection coil. To fill up losses in the circuit arrangement, a power supply source is provided for generating a DC voltage of high value, often with stabilization facilities for keeping the said value constant. This source is coupled to the deflection circuit by means of a smoothing capacitor of high capacitance and an storage inductance of high value. During the trace time the current flows through the storage inductance and the energy stored therein causes a compensating current to the resonant network during the retrace time. The average value of the trace voltage is substantially equal to the voltage of the source.

SUMMARY OF THE INVENTION

It is an object of the invention to provide a circuit arrangement in which the power supply source, the smoothing capacitor and the storage inductance, which are expensive components, are not required. To this end a circuit arrangement of the type described above is characterized in that the series circuit also comprises a voltage source, the losses in the series circuit being so low that the sum of the DC components of the voltage of the source and of the voltage across the trace capacitor is many times higher, at least 5 times, than the amplitude of the AC component of the source.

The invention is based on the recognition that at the line frequency, i.e. for example 15,625 kHz according to the European television broadcasting standard, the losses in the circuit arrangement, which are predominantly ohmic losses, represent an equivalent resistance whose value is low relative to the reactance of the deflection coil. A ringing effect is caused in the circuit arrangement because the AC voltage source applies energy to the trace capacitor during each period so that the sum of the DC components of the voltage of the source and of the trace voltage becomes many times higher in the course of the time than the amplitude of the AC component of the source after switching on the circuit arrangement. The trace voltage is filled up every time, which more than compensates for the losses, until there is a balance. The trace capacitor thus functions as an energy source for the deflection circuit without a separate power supply source being required.

It is to be noted that at first sight the circuit arrangement according to the invention has a similar structure as a field deflection circuit of the known type. However, at the low field frequency, i.e 50 Hz in the said standard, the ohmic losses in the circuit arrangement, which also represent an equivalent resistance, have a very high value relative to the reactance of the field deflection coil, which value is so high that, as is known, this coil behaves as an ohmic resistance during the field trace time. A ringing effect, as stated above, thus cannot occur and a capacitor which is often arranged in series with the deflection coil cannot function as an energy source but only ensures a DC separation. At certain DC levels this capacitor is dispensed with.

The circuit arrangement according to the invention is advantageously characterized in that the variation of the voltage of the source is adjustable for determining the variation of the deflection current. Due to this measure the variation of the current during the trace time can be influenced at a low level so that this current can be given a desired variation.

In a preferred embodiment the circuit arrangement according to the invention is characterized by measuring means for measuring the variation of the line deflection current during the trace time and by a comparison stage for comparing the measured variation with a predetermined variation and for controlling the voltage of the source by means of a control loop as a function of the difference between the compared variations This is the control for obtaining a desired variation of the current. Such a voltage control loop is known per se from U.S. Pat. No. 3,914,654. However, in the circuit arrangement described in this Patent a power supply circuit is provided for the supply of the deflection circuit and there is no trace capacitor.

In this preferred embodiment the circuit arrangement according to the invention is further characterized by a retrace waveform generator coupled to the comparison stage for supplying, with reference to the difference established between the compared variations and with reference to the derivative with respect to time of the said difference, a first output voltage for determining the value of the deflection current at the starting instant of the trace, and a second output voltage for determining the starting instant of the retrace. The circuit arrangement is thus provided with three controls so that the deflection current has a predetermined variation. Since the value of the deflection current is determined at the start of the trace and since the starting instant of the retrace and hence the starting instant of the trace are determined, the deflection current is completely determined.

BRIEF DESCRIPTION OF THE DRAWINGS

The invention will now be described in greater detail by way of example with reference to the accompanying drawings in which.

DETAILED DESCRIPTION OF A PREFERRED EMBODIMENT OF THE INVENTION

Figure 1:
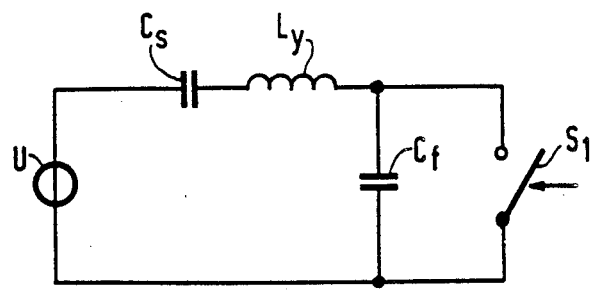
FIG. 1 is a simplified basic circuit diagram of the circuit arrangement according to the invention and FIG. 2 is a more detailed circuit diagram of the circuit arrangement according to the invention.

In the circuit arrangement of FIG. 1 the reference Ly denotes a line deflection coil for electro-magnetically deflecting one or more electron beams in the horizontal direction in a picture display tube (not shown). Arranged in series with the coil Ly are an AC voltage source U, a trace capacitor Cs and a retrace generator including a retrace capacitor Cf arranged parallel (o a line frequency-controlled, bidirectionally conducting switch S1. During the trace time, i.e. the time in which switch S1 is conducting, the capacitor Cf is short-circuited by the switch. The circuit arrangement then consists of the series circuit of the source U, the capacitor Cs and the coil Ly through which series circuit a line deflection current flows. During the retrace time, i.e. the time in which the switch is open, the trace capacitor Cs, the capacitor Cf and the coil Ly constitute a resonant network in which the resonant frequency is determined by the inductance of the coil and predominantly by the capacitance of the capacitor Cf which is much smaller than that of the capacitor Cs. A resonant frequency oscillation is produced in this network. The deflection current, which has reached a maximum value in one direction at the end of the previous trace time, quickly decreases, reverses its direction and at the end of the retrace time it assumes a value which is equal to the said maximum value. At this instant the switch S1 is again closed, which initiates a new trace. The deflection current has the line frequency and a sawtooth shape due to the periodical closing and opening of the switch.

The AC voltage source U ensures that the trace capacitor Cs is brought and kept at the correct voltage. When switching on the picture display device, of which the circuit arrangement of FIG. 1 forms part, control signals are applied to the switch S1 so that it is rendered alternately closed and open. The source U supplies energy to the series network constituted by the coil Ly and the capacitor Cs, so that a voltage is built up across the capacitor Cs. The line frequency is so high, for example 15,625 kHz according to the European television standard, that the losses in the circuit arrangement, which are predominantly ohmic losses, represent an equivalent resistance whose value is low relative to the reactance of the coil Ly. The source U ensures the active deattenuation of the series network so that the sum of the DC components of the voltage of the source and of the trace voltage across the capacitor Cs increases each cycle. The deflection current flowing through the series network initially has a linear variation as a function of time, more specifically if the capacitance of the capacitor Cs is very large. The amplitude of this current increases with each cycle. Thus, a ringing effect occurs so that the sum of the DC components of the trace voltage of the source U and of the voltage across the capacitor Cs becomes many times higher after some time than the amplitude of the AC voltage of the source. The trace voltage is restored every period and increased by the AC voltage source, which more than compensates for the losses until there is a balance, whereafter the trace voltage and the amplitude of the line deflection current flowing through the series network no longer increase In this stationary state the trace voltage has reached its maximum value. This voltage functions as an energy source for the deflection current.

It is apparent from the foregoing that in the circuit arrangement of FIG. 1 the AC voltage of the source U is converted into the DC voltage which is present across the capacitor Cs for compensating for the losses without a power supply circuit being present which, as is common practice in the known circuit arrangements, would generate a DC voltage which would be coupled to the line deflection circuit via a smoothing capacitor and a choke It will be noted that the variation as a function of time of the deflection current is initially determined by the values of the elements Cs, Ly and Cf and by the duration of the conductivity time of the switch S1, and not by the variation of the voltage of the source U. The variation of the deflection current can be given an S shape in the conventional manner by choosing a suitable value which is not infinitely large for the capacitance of the capacitor Cs. If desired, the shape of the deflection current may be influenced by other elements (not shown) in the circuit arrangement.

In this respect it is to be noted that the circuit arrangement of FIG. 1 can be modified in known manner without a difference in operation. For example, the capacitor Cf can be arranged parallel to the deflection coil. The source U can also be coupled to the series circuit by means of a transformer.

In one embodiment of the circuit arrangement according to the invention the source U had an amplitude of 10 V, the amplitude of the deflection current I had a value of 2.4 A and the trace voltage Us had a value of 100 V. A ringing effect of at least 5 is thus certainly feasible.

Figure 2:
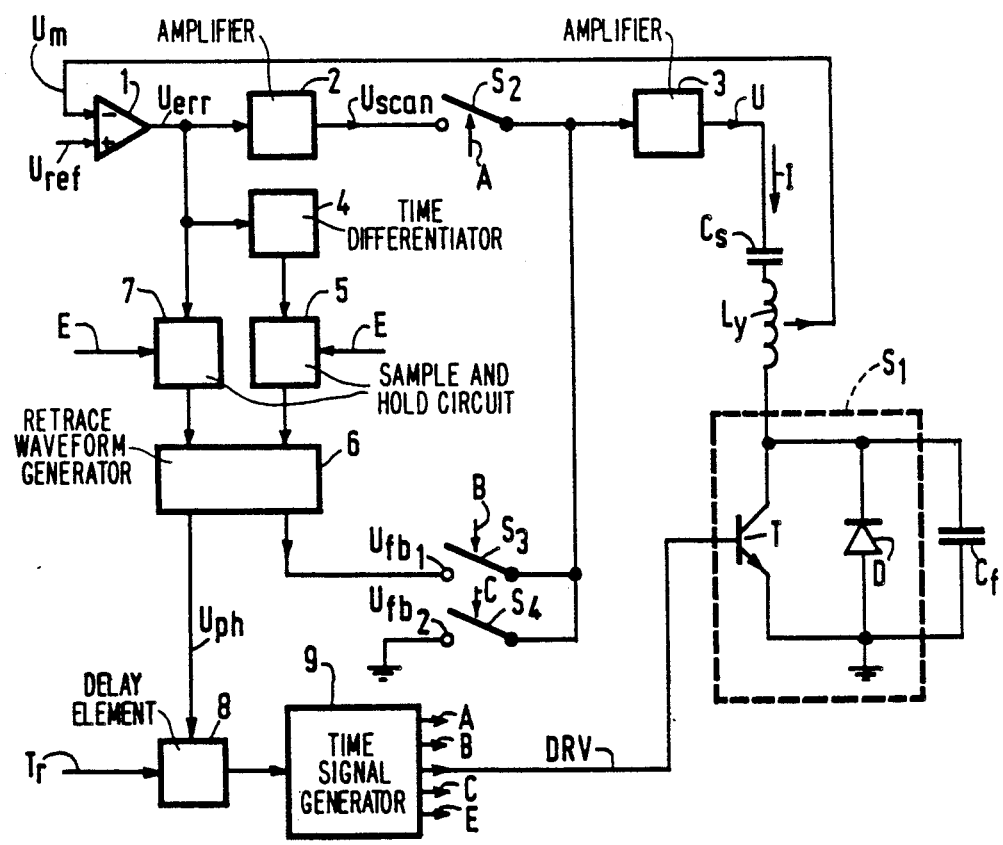

FIG. 2, in which corresponding elements of FIG. 1 have the same reference symbols, shows an embodiment of the circuit arrangement according to the invention in which the desired variation of the deflection current is determined by a plurality of controls. In this embodiment the switch S1 of FIG. 1 is formed as an npn switching transistor T and a diode D whose conductivity direction is opposed to the conductivity direction of the transistor.

The control system has a voltage Uref as input signals, which voltage is a measure of the value of the desired current during the trace time, a voltage Um which is a measure of the value of the actually flowing line deflection current I and a time reference signal Tr. The voltage Um is, for example the voltage which is present across a low value resistor which is arranged in series with the coil Ly or the voltage across the secondary winding of a current transformer whose primary winding is in series with the coil Ly. The signal Tr comes, for example, from a line oscillator which generates a local signal in known manner, which signal is substantially in synchronism with an incoming line synchronizing signal. The output signals of the control system are the required source voltage U and a control signal DRV for the retrace generator.

A comparison stage 1 receives the input signals Um and Uref. Stage 1 compares these signals and the difference between these two signals is amplified. The output voltage of stage 1, i.e. the error signal Uerr, is a measure of the deviation between the current I and the desired deflection current and is applied to an amplifier 2. Since the impedance across which the voltage U is present predominantly consists of an inductance and an ohmic resistance, this voltage is integrated by the network to the current I, and therefore the amplifier 2 comprises a differentiating and a proportional portion. In the case of a correct dimensioning the behaviour of the control system is substantially independent of the frequency in the operating range of the amplifier. An output of amplifier 2 supplies a correction voltage Uscan which is applied to an output amplifier 3 via a switch S2 which is conducting during the trace time and non-conducting during the retrace time. In the output amplifier the voltage Uscan is amplified to form the source voltage U.

It is apparent from the foregoing that the elements 1, 2, 3 and S2 form part of a control loop which is closed during the trace time and which is interrupted during the retrace time for obtaining the desired variation of the current I during the trace time. The loop adjusts itself in such a way that the variation of the voltage U has the line frequency and is essentially sawtooth-shaped. The input voltage Uref can be adjusted at a low level for adjusting the desired variation of the current 1. This is the linearity adjustment. Moreover, Uref can be amplitude-modulated at the field frequency so that the current I undergoes the same modulation for the correction of the east-west distortion, for example with a parabolic envelope having a maximum in the middle of the field trace.

The error signal Uerr is also applied to a differentiator 4 which determines the deriviative with respect to time of the signal Uerr. The derivative is applied to a first sample and hold circuit 5 which receives a pulse E at a sampling instant. The value at this instant is applied to a first input of a retrace waveform generator 6. The error signal is also applied to a second sample and hold circuit 7 which receives the same sampling pulse E and which supplies the value at the sampling instant to a second input of the retrace waveform generator. The said instant is located at the end of the retrace time. The value at the second input of generator 6 is a measure of the deviation of the value of the current I at the sampling instant relative to the desired value, and the value at the first input is a measure of the deviation of the value of the voltage across the deflection coil relative to the desired value at the same instant. The generator 6 comprises a matrix circuit and two integrators. The matrix circuit produces in known manner a first linear combination of the two sampled input signals and this linear combination yields a first output voltage Ufb1 after integration in a first integrator. The second term of the linear combination is proportional to the deviation of the deflection current. The first term of the linear combination is proportional to the deviation of the voltage across the coil. During a first part of the retrace time, i.e. when a switch S3 is conducting, Ufb1 is applied to the output amplifier 3. The switch S3 is open during the rest of the period. The voltage Ufb1 is calculated by the retrace waveform generator 6 as discussed above as determined by the duration for which switch S3 is closed and the voltage Uerr provided via sample and hold circuit 7, in such a way that voltage U has the correct value for compensating losses occurring in the deflection circuit.

If the error signal Uerr and the derivative of Uerr are zero, this implies that the losses are exactly compensated for and during the first part of the retrace time the same voltage Ufb1 is applied to the output amplifier 3 as in the previous retrace time.

During a second part of the retrace time a fixed reference voltage Ufb2 is applied to the output amplifier via a switch S4 which is only conducting during this second part. These two parts of the retrace time may be, for example two equal parts, which has the advantage that the current I at the switching instant is equal to zero.

The control by means of the retrace waveform generator ensures that the error signal is zero at the start of the trace time. As a result the voltage Uscan at the output of the amplifier 2 also has the zero value. To ensure that the output amplifier 3 at the input does not have to endure a voltage jump, voltage Ufb2 has the zero value. It will be evident that in another embodiment a jump can be prevented by choosing the same value for Ufb2 when the switch S2 is rendered conducting at an instant when the voltage Uscan has a value which is unequal to zero.

The matrix circuit, which forms part of the retrace waveform generator 6, also produces a second linear combination of the two sampled input signals, which combination yields a second output voltage Uph via a second integrator. The voltage Uph is applied to a control input of a controllable delay element 8. The time reference signal Tr is the input signal of this delay element and is delayed, dependent on the voltage Uph. A time signal generator 9 receives the delayed signal from the delay element and in response thereto it determines at which instant the switches S1, S2, S3 and S4 must be rendered conducting or non-conducting. For this purpose the generator 9 applies the respective signals DRV, A, B and C to these switches, as well as the signal E for the circuits 5 and 7. The delayed signal generated by delay element 8 consists of delayed Tr as control by Uph. Time signal generator 9 generates timing signals A, B, C, E and DRV in a known manner to accomplish the switching sequence described herein. The signal DRV drives the base of the transistor T with a negatively directed edge and thereby determines the starting instant of the retrace. The control loop with switch S3 determines the amplitude of the current I at the start of the trace and the control loop with switch S1 determines the starting instant of the retrace and therefore the starting instant of the trace. Since the control loop with switch S2 determines the current I during the trace, the variation of the current is completely determined.

The matrix circuit could also have a memory function for storing the values of Uerr and the derivative of Uerr and it could take these old values into account in the calculation, but this has not been done in this embodiment. It is alternatively possible to have an embodiment without a matrix circuit in which Ufb1 is determined only with reference to Uerr and Uph is determined with reference to the deriviative of Uerr.

The details of the circuit arrangement of FIG. 2 are not essential for the invention: this applies, for example to the position of the differentiator 4 in the arrangement. In another embodiment it is possible for the output signal of the comparison stage 1 to be the derivative of the error signal Uerr. To obtain the two input signals for the retrace waveform generator 6, an integrator must be incorporated in the path of the circuit 7.

I claim:

1. A circuit arrangement for use in a picture display device, which generates an essentially sawtooth-shaped line deflection current through a deflection coil, said circuit comprising, in a series circuit;
   (a) a trace capacitor;
   (b) said line deflection coil which forms a resonant circuit with said trace capacitor;
   (c) a bidirectionally conducting, line frequency controlled switch which conducts during a trace time and does not conduct during a retrace time; and (d) a source voltage providing AC and DC voltage components to said circuit;

wherein the sum of the DC voltage component of said source voltage and a DC voltage developed by said source voltage across said trace capacitor has a value at least 5 times greater than said AC component.

2. A circuit arrangement as claimed in claim 1, wherein the variation of the source voltage of the source is adjustable.

3. A circuit arrangement as claimed in claim 2, wherein the source voltage varies at the line frequency and is essentially sawtooth-shaped.

4. A circuit arrangement as claimed in claim 3, further comprising:
   (a) measuring means for measuring the variation of the line deflection current during the trace time;
   (b) a comparison means coupled to said measuring means, for comparing the measured variation to a predetermined variation so as to generate a control signal representing the difference between said measured variation and said predetermined variation; and
   (c) a control loop coupled to said comparison means, for controlling the source voltage as a function of said control signal.

5. A circuit arrangement as claimed in claim 4, wherein the control loop also comprises a second switch incorporated in a signal path for closing the control loop during the trace time and for interrupting the control loop during the retrace time.

6. A circuit arangment as claimed in claim 4, wherein the control loop comprises an amplifier having a proportional and a differentiating portion.

7. A circuit arrangement as claimed in claim 4, further comprising a retrace waveform generator coupled to the comparison stage for supplying, with reference to the difference established between the compared variations and with reference to the derivative with respect to time of the said difference, a first output voltage for determining the value of the deflection current at the starting instant of the trace, and a second output voltage for determining the starting instant of the retrace.

8. A circuit arrangement as claimed in claim 7, wherein an input of a second sample and hold circuit is connected to an output of the comparison stage and an output is connected to a first input of the retrace waveform generator, and in that an input of a differentiator is connected to the output of the comparison stage, the output of the differentiator being connected to a first sample and hold circuit an output of which is connected to a second input of the retrace waveform generator.

9. A circuit arrangement as claimed in claim 8, wherein the sampling instant of both the first and the second sample and hold circuit is the final instant of the retrace.

10. A circuit arrangement as claimed in claim 7, wherein the retrace waveform generator comprises a matrix circuit for supplying a first linear combination to a first integrator for generating the first output voltage, and for supplying a second linear combination to a second integrator for generating the second output voltage of the retrace waveform generator.

11. A circuit arrangement as claimed in claim 10, wherein the retrace waveform generator supplies the first output voltage during a first part of the retrace time for determining the voltage of the source voltage, and, a fixed reference voltage determining the voltage of the source voltage during a subsequent second part.

12. A circuit arrangement as claimed in claim 11, wherein the two parts constituting the retrace time have the same duration.

13. A circuit arrangement as claimed in claim 7, wherein the second output voltage of the retrace waveform generator is the control signal of a controllable delay element, with a time reference signal as an input signal.

14. A circuit arrangement as claimed in claim 13, wherein the output of the delay element is coupled to a control electrode of the first switch for determining the blocking instant of said switch at the starting instant of the retrace.

15. A circuit arrangement as claimed in claim 5 wherein the output of the delay element controls a time signal generator for determining the switching instants of the second switch, for determining the two parts of the retrace time and for determining the sampling instant.

16. A circuit arrangement as claimed in claim 8, wherein the output of the delay element controls a time signal generator for determining the switching instants of the second switch, for determining the two parts of the retrace time and for determining the sampling instant.

17. A circuit arrangement as claimed in claim 11, wherein the output of the delay element controls a time signal generator for determining the switching instants of the second switch, for determining the two parts of the retrace time and for determining the sampling instant.

18. A circuit arrangement as claimed in claim 13, wherein the output of the delay element controls a time signal generator for determining the switching instants of the second switch, for determining the two parts of the retrace time and for determining the sampling instant.

* * * * *